(12) United States Patent
Yang

(10) Patent No.: US 9,325,286 B1
(45) Date of Patent: Apr. 26, 2016

(54) AUDIO CLIPPING PREVENTION

(71) Applicant: Rawles LLC, Wilmington (DE)

(72) Inventor: Jun Yang, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 429 days.

(21) Appl. No.: 13/858,818

(22) Filed: Apr. 8, 2013

(51) Int. Cl.
*H03G 3/20* (2006.01)
*H03G 7/00* (2006.01)

(52) U.S. Cl.
CPC ... *H03G 3/20* (2013.01); *H03G 7/00* (2013.01)

(58) Field of Classification Search
CPC ....... H03G 7/007; H03G 7/008; H03G 9/025; H03G 9/005; H03G 7/06; H03G 3/3005; H03G 11/00; H03G 3/3089; H04R 3/00; H03F 2200/331
USPC ............................ 381/104, 106, 107, 55, 120
See application file for complete search history.

(56) References Cited

U.S. PATENT DOCUMENTS

| | | | | |
|---|---|---|---|---|
| 6,744,882 | B1* | 6/2004 | Gupta et al. ............. | 379/387.01 |
| 7,013,011 | B1* | 3/2006 | Weeks et al. .................... | 381/98 |
| 7,139,403 | B2* | 11/2006 | Richardson et al. .......... | 381/107 |
| 8,036,402 | B2* | 10/2011 | Furge ............................ | 381/120 |
| 8,488,811 | B2* | 7/2013 | Smithers et al. .............. | 381/107 |
| 2002/0051546 | A1* | 5/2002 | Bizjak ........................... | 381/106 |
| 2002/0076072 | A1* | 6/2002 | Cornelisse .................... | 381/312 |
| 2002/0181724 | A1* | 12/2002 | Jiang et al. .................... | 381/106 |
| 2005/0123152 | A1* | 6/2005 | Magrath ....................... | 381/104 |
| 2009/0161889 | A1* | 6/2009 | Magrath ....................... | 381/107 |

OTHER PUBLICATIONS

Giannoulis, et al., Digital Dynamic Range Compressor Design—A Tutorial and Analysis, J. Audio Eng. Soc., vol. 60, No. 6, Jun. 2012, pp. 399-408.
Pinhanez, "The Everywhere Displays Projector: A Device to Create Ubiquitous Graphical Interfaces", IBM Thomas Watson Research Center, Ubicomp 2001, Sep. 30-Oct. 2, 2001, 18 pages.

* cited by examiner

*Primary Examiner* — Xu Mei
*Assistant Examiner* — David Ton
(74) *Attorney, Agent, or Firm* — Lee & Hayes, PLLC

(57) ABSTRACT

Audio clipping is prevented by attenuating an audio signal in accordance with values retrieved from a gain table. Corresponding amplitude values of a stereo audio signal are evaluated to determine a maximum of the values. The amount by which the maximum exceeds a predetermined threshold is used to calculate a table index, which is used to retrieve a gain value from the gain table. The gain value is then applied to the audio signal. The gain table is configured so that increasing index values produce decreasing gain values.

22 Claims, 4 Drawing Sheets

AUDIO CLIPPING PREVENTION

BACKGROUND

Audio signal clipping can occur in audio systems when a component within an audio device receives or produces an audio signal that exceeds the levels that the device is equipped to output. In response to a signal such as this, the device may produce an output in which the peaks of an otherwise sinusoidal waveform are flat or "clipped," such that portions of the waveform become more like a square wave. Audio signal clipping can introduce harmonic distortion and other anomalies that may degrade audio quality.

Clipping may result from various types of signal processing that potentially increase signal amplitudes relative to original input levels. Examples of audio processing that can result in output clipping include various filtering; automatic gain control (AGC); equalization (EQ); audio beamforming; echo cancellation; noise reduction; and various other types of audio processing techniques that involve conversion between time and frequency domains.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Described herein are techniques for attenuating audio signals to reduce clipping in audio processing systems. In certain embodiments, the absolute amplitude of an audio signal is compared to an attenuation threshold, where the attenuation threshold is less than the value at which clipping will occur. When the absolute amplitude exceeds the attenuation threshold, a lookup table is referenced to obtain a gain value, and the gain value is applied to the audio signal. The lookup table stores multiple gain values at corresponding address offsets or index values. The lookup table is configured so that increasing index values correspond to decreasing gain values.

When the absolute amplitude of the audio signal exceeds the attenuation threshold, a table index is calculated based on the amount by which the absolute amplitude exceeds the attenuation threshold. Specifically, the amount by which the absolute amplitude exceeds the attenuation threshold is multiplied by a predetermined constant to produce a table index that is used to index the lookup table. The gain value at the table index of the lookup table is retrieved and used to attenuate the audio signal amplitude.

Figure 1:
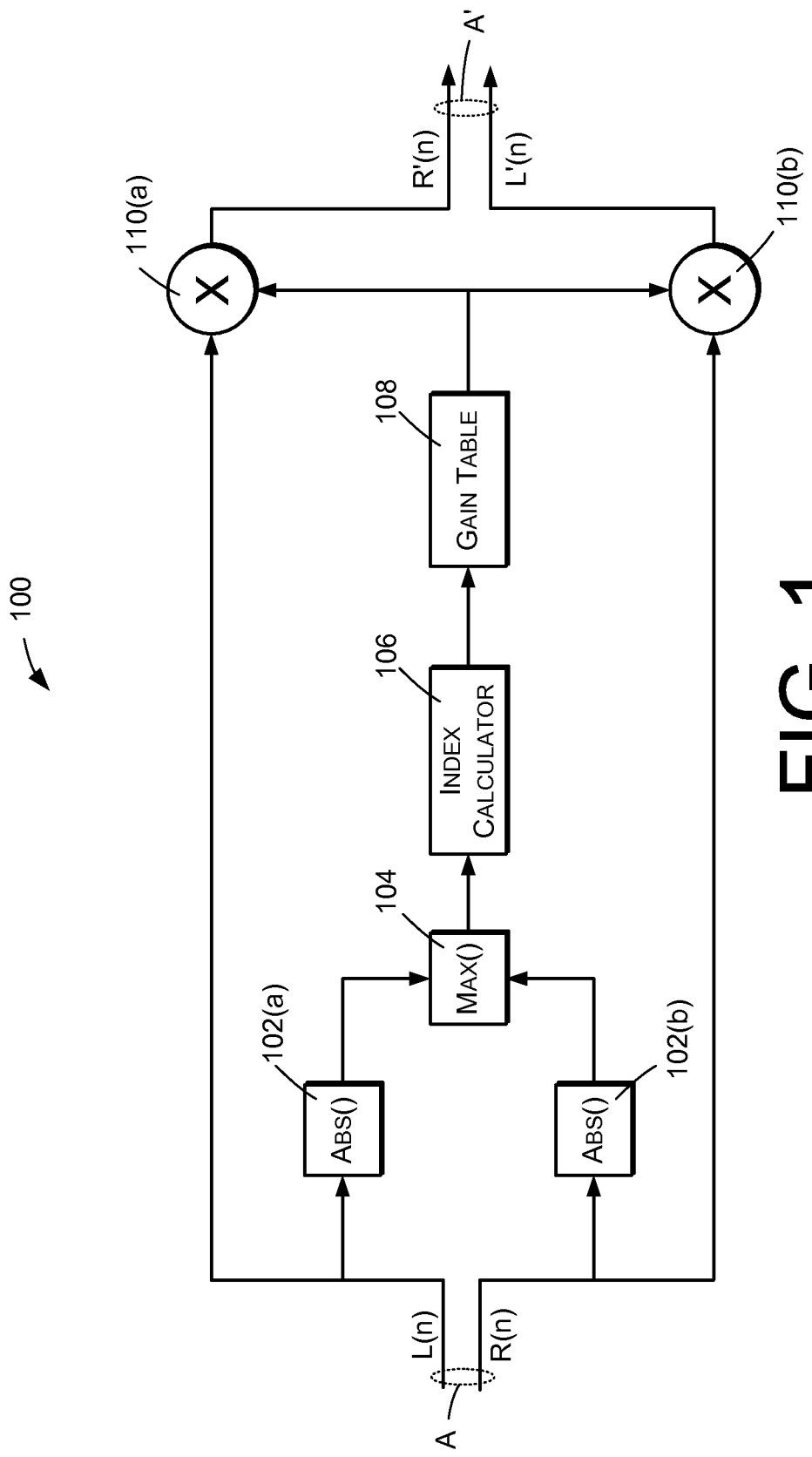
FIG. 1 is a block diagram illustrating an example of a clipping preventer that may be used to prevent clipping in audio signals.

FIG. 1 shows an example of a clipping preventer 100 that may be implemented as an audio processing component or process to filter or process a received stereo audio signal A to prevent signal clipping. In the environment of FIG. 1, the stereo audio signal A may comprises a series or sequence of stereo amplitudes. Each stereo amplitude may comprise a left audio amplitude value and a corresponding right audio amplitude value. Left and right audio amplitude values corresponding to an individual stereo amplitude are referred to respectively as L(n) and R(n), indicating the $n^{th}$ received samples or values of left and right stereo channels, respectively. In a digital processing environment, each of the left and right audio amplitude values may comprise a positive or negative digital value.

The clipping preventer 100 may be part of a signal processing path in which various functions or operations are used to process the audio signal before providing the signal to output components that may clip the signal. More specifically, the clipping preventer 100 is positioned downstream of processing components that may produce signal amplitudes that exceed a clipping level, and upstream of output components that may produce output clipping in response to such signal amplitudes.

The clipping preventer 100 may comprise a pair of processing functions or components 102(a) and 102(b) that are configured to find or determine the absolute amplitude value of each of the left and right audio amplitude values L(n) and R(n), respectively. The clipping preventer 100 may also comprise a processing function or component 104 that is configured to identify or determine a maximum of the absolute values of the left and right audio amplitude values L(n) and R(n).

The clipping preventer 100 may also comprise an index calculator function or component 106 that is configured to calculate a table index, based on the maximum of the absolute values of the left and right audio amplitude values L(n) and R(n). The clipping preventer 100 includes a lookup table 108, also referred to as a gain table 108, which stores gain values at corresponding index values. The table index calculated by the index calculator 106 is used to index the gain table 108 and to retrieve a gain value based on the table index.

The retrieved gain value is applied to both of the left and right audio amplitude values L(n) and R(n) by multipliers 110(a) and 110(b), respectively, to produce left and right output amplitude values L'(n) and R'(n). The left and right output amplitude values L'(n) and R'(n) form the left and right components of an output stereo audio signal, which is referred to in FIG. 1 as A'.

Figure 2:
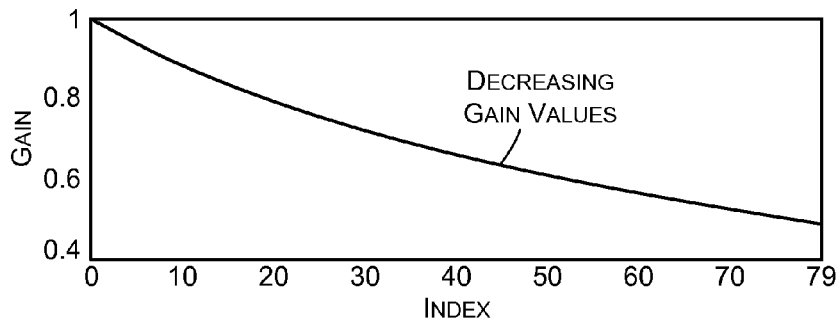
FIG. 2 is a graph illustrating a correspondence of gain values to index value in an example gain table.

FIG. 2 illustrates an example configuration of gain values that may be stored by the gain table 108. The horizontal axis of FIG. 2 corresponds to index values of the gain table 108, which in this case range from 0 to 79. Each index value corresponds respectively to a gain value.

The vertical axis of FIG. 2 corresponds to the gain values stored by the gain table at the corresponding index values of the horizontal axis. The index values of the gain table 108 correspond to input values that are greater than the attenuation threshold. The input values correspond to the maximums of the absolute values of the left and right audio amplitude values L(n) and R(n). Increasing index values thus correspond to increasing amplitude values.

As is apparent from FIG. 2, the gain values are configured to decrease as a function of increasing index values, where the index values correspond to amplitude input values that exceed the attenuation threshold. In the particular example shown, when the maximum absolute value of input is larger than the attenuation threshold, dividing the maximum value by the predetermined threshold results in a value y that is larger than or equal to 1.0. The gain values are configured to decrease, from a unity gain, as a power function of the increasing y values. The power function is represented as $y^{-\alpha}$ where y is the base and $-\alpha$ is the exponent, and where a is larger than the attenuation threshold and smaller than 1.0.

Figure 3:
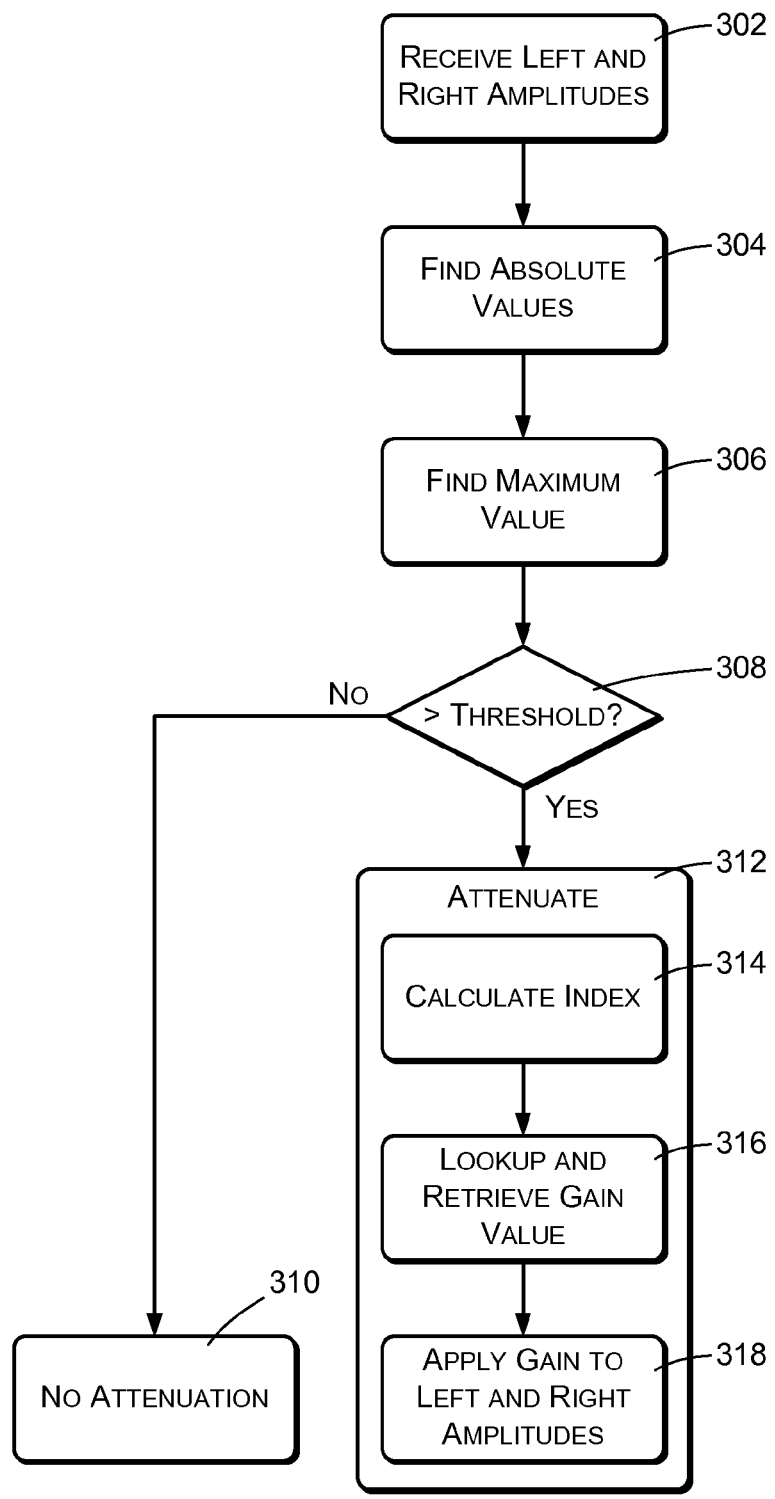
FIG. 3 is a flowchart illustrating a process of clipping prevention.

FIG. 3 illustrates an example process 300 that may be performed in the environment of FIG. 1 to prevent clipping in a stereo audio signal. The process 300 is described with reference to a single stereo amplitude and a single pair of left and right audio amplitude values. The process 300 is repeated with respect to each received pair of left and right audio amplitude values.

An action 302 comprises receiving a sequence of stereo amplitudes, where each stereo amplitude comprises a left audio amplitude value and a right audio amplitude value. The stereo audio amplitudes may be received from upstream audio processing components or elements of a signal processing path.

An action 304 comprises determining or finding absolute values of the received left and right audio amplitude values. An action 306 comprises determining or identifying the maximum of the absolute values of the received left and right audio amplitude values.

An action 308 comprises comparing the maximum of the absolute values of the received left and right audio amplitude values to a predetermined threshold, wherein the predetermined threshold is less than a known clipping value at which output clipping is known to occur. As an example, the predetermined threshold may be set at 90% of a value that is known to result in output clipping.

If the identified maximum of the action 306 is not above the predetermined threshold, an action 310 is performed, which comprises applying no attenuation to the received left and right audio amplitude values. The action 310 may comprise applying a unity gain to both of the received left and right audio amplitude values. The lookup table need not be referenced when the identified maximum is less than the predetermined threshold.

If the identified maximum of the action 306 is above the predetermined threshold, an action 312 is performed, comprising attenuating both the left and right received audio amplitude values based on a gain value retrieved or obtained from the gain table 108. More specifically, the action 312 may comprise an action 314 of calculating a table index based on the amount by which the identified maximum amplitude value exceeds the predetermined threshold. The table index is used in an action 316 of looking up a particular gain value from the gain table 108, and of retrieving the particular gain value from the gain table 108.

An action 318 comprises applying the retrieved gain value to both of the left and right received audio amplitude values by multiplying each of the amplitude values by the gain value.

In one embodiment, the table index is calculated in the action 314 as follows:

$$\text{Index} = \text{integer portion of } ((x - \text{Threshold}) * K)$$

where
  Threshold is the predetermined threshold;
  x is the amount by which the maximum of the absolute values of the left and right audio amplitude values exceeds Threshold; and
  K is a constant.

In a specific example, suppose that desired signal output amplitude values range from 0 to 1, and that output components downstream of the clipping preventer will produce output clipping if the audio signal amplitudes exceed a clipping value of 1. Further suppose that various processing performed upstream of the clipping preventer 100 produces an input signal A having amplitude values that may be as high as 2.0. It is desired in this situation to smoothly attenuate the left and right audio amplitude values so that they are constrained to the range of 0 to 1.

A gain table having the characteristics illustrated by FIG. 2 may be used in this situation to produce gain values. In this example, possible index values of the gain table range from 0 to 79.

The predetermined threshold—the point at which the gain table is referenced and decreasing gains are applied—may be set at a value that is less than the clipping threshold, such as 0.9. The constant K may be calculated so that a desired range of input audio amplitude values will produce table indexes within the available range of gain table index values, which in this case is 0 to 79. A suitable constant K in this example is equal to 71.81818, which allows input audio amplitude values up to 2.0 to map directly into the gain table 108.

Figure 4:
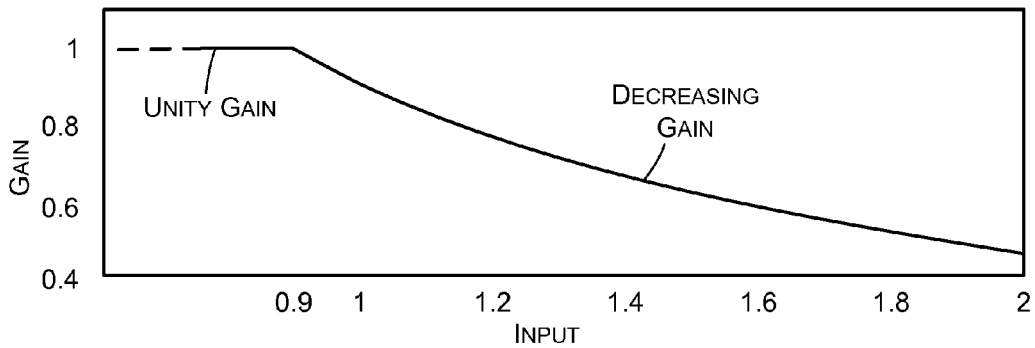
FIG. 4 is a graph illustrating an example of gain applied to an input signal by the clipping preventer of FIG. 1 in an example configuration.

FIG. 4 illustrates gains that are produced by the described process of FIG. 3 in the example defined above. At all amplitude values less than 0.9, a unity gain (a gain of 1.0) is used in accordance with the action 310, without reference to the gain table 108. At amplitude values that exceed the threshold of 0.9, the gain table 108 is referenced to obtain gain values that decrease with increasing input amplitude values.

Figure 5:
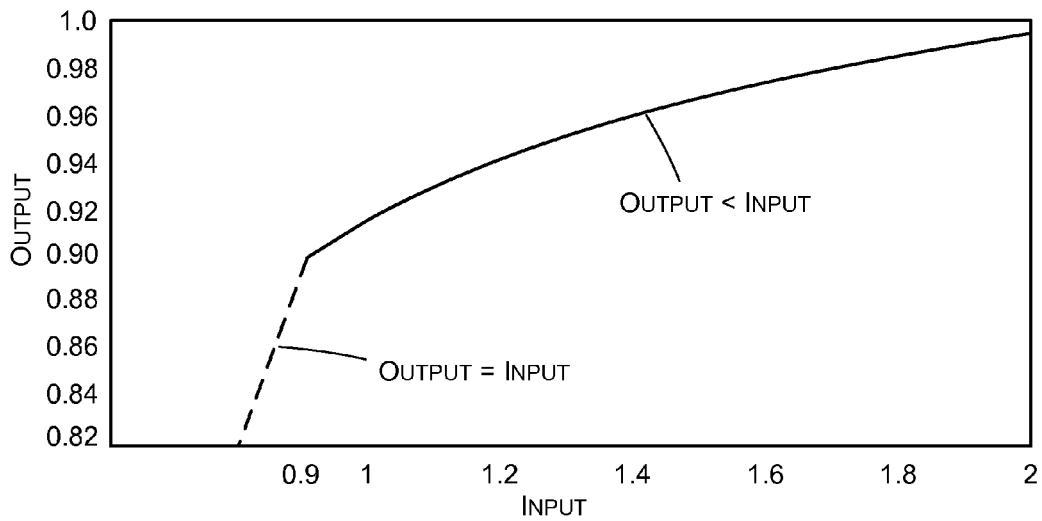
FIG. 5 is a graph illustrating output of a clipping preventer in an example configuration.

FIG. 5 illustrates output amplitudes produced by the described process of FIG. 3 in the example defined above in response to an input signal. The horizontal axis of FIG. 5 corresponds to input audio amplitude values and the vertical axis corresponds to output audio amplitude values. At all input amplitude values less than 0.9, a unity gain results in an output amplitude value that is equal to the input amplitude value. At amplitude values that exceed the threshold of 0.9, output values are increasingly attenuated in comparison to the corresponding input values, so that the output values approach the clipping value of 1.0 asymptotically with increasing input values.

Figure 6:
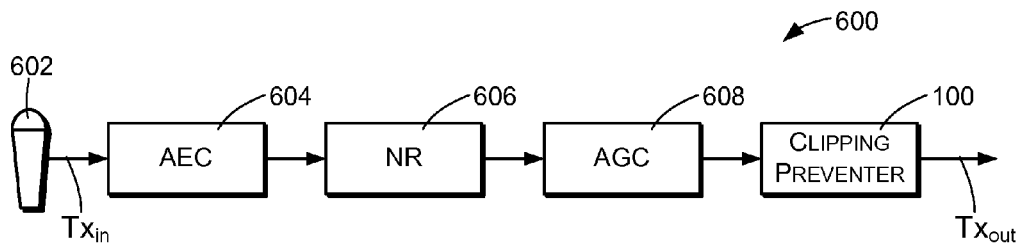
FIGS. 6 and 7 are block diagrams illustrating example audio processing systems in which the clipping preventer of FIG. 1 may be utilized.
Figure 7:
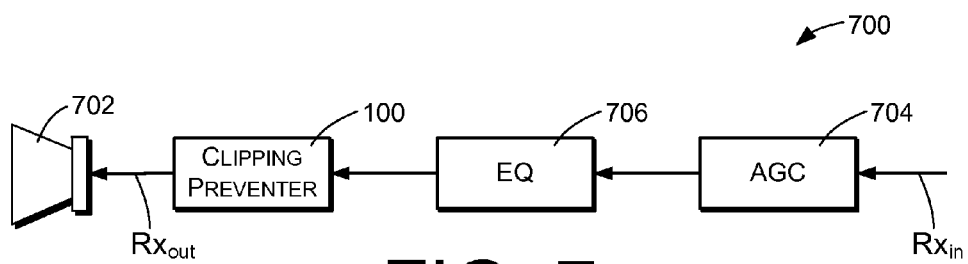

FIGS. 6 and 7 illustrate examples of systems in which a clipping preventer such as described above may be utilized. FIG. 6 illustrates a transmit audio processing path 600 that may be part of a communications device or other audio input device. The transmit audio processing path 600 receives an audio signal $Tx_{in}$ from a microphone 602 and processes the audio signal using a sequence of processing components. The processing components may include an acoustic echo cancellation (AEC) function or component 604, a noise reduction (NR) or cancellation function or component 606, and an automatic gain control (AGC) function or component 608. The clipping preventer 100 may be placed after these processing components to prevent clipping that may otherwise result from signal modifications performed by the upstream processing components 604, 606, and 608. The clipping preventer 100 produces a transmit path output signal $Tx_{out}$ that may be provided to downstream output drivers, transmitters, or ports. The clipping preventer assures that the output signal $Tx_{out}$ is attenuated as needed so that it does not exceed output values of 1.0

FIG. 7 illustrates a receive audio processing path 700 that may similarly be part of a communication device or other audio generation device. In some cases, the receive audio processing path 700 may be used in conjunction with the transmit audio processing path 600 as part of a two-way communications device, such as a headset, handset, speakerphone, etc.

The receive audio processing path 700 receives an audio signal $Rx_{in}$ from an external source such as a remote audio communications or generation device, and processes the received audio signal using a sequence of processing components to produce an output audio signal $Rx_{out}$ that drives a speaker 702. The processing components may include an automatic gain control (AGC) function or component 704 and an equalizer function or component 706. The clipping preventer 100 may be placed downstream of the illustrated processing components 704 and 706 to prevent clipping that may otherwise result from signal modifications performed by the processing components of the receive audio processing path 700.

A clipping preventer such as described above can be used in various other situations, not limited to the examples of FIGS. 6 and 7. For example, a clipping preventer such as described herein may be used to process the output of any type of audio processing component or filter, including echo cancellation components, noise reduction components, gain control components, equalization components, band-pass filters, and so forth. Furthermore, the described clipping preventer may be used in conjunction with non-stereo signals, such as signals containing a single audio channel and signals containing more than two audio channels.

Figure 8:
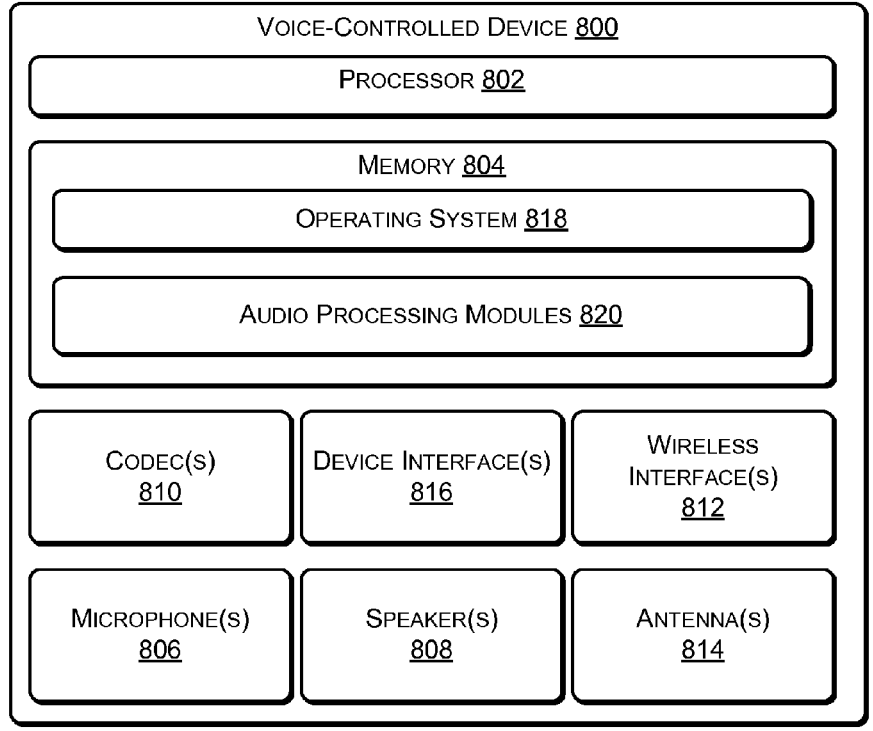
FIG. 8 is a block diagram of a system that may be used to apply clipping prevention in accordance with the techniques described herein.

FIG. 8 shows an example of an audio system, element, or component that may be configured to perform clipping prevention in accordance with the techniques described above. In this example, the audio system comprises a voice-controlled device 800 that may function as an interface to an automated system. However, the devices and techniques described above may be implemented in a variety of different architectures and contexts. For example, the described clipping prevention may be used in various types of devices that perform audio processing, including mobile phones, entertainment systems, communications components, and so forth.

The voice-controlled device 800 may in some embodiments comprise a module that is positioned within a room, such as on a table within the room, which is configured to receive voice input from a user and to initiate appropriate actions in response to the voice input. In the illustrated implementation, the voice-controlled device 800 includes a processor 802 and memory 804. The memory 804 may include computer-readable storage media ("CRSM"), which may be any available physical media accessible by the processor 802 to execute instructions stored on the memory 804. In one basic implementation, CRSM may include random access memory ("RAM") and flash memory. In other implementations, CRSM may include, but is not limited to, read-only memory ("ROM"), electrically erasable programmable read-only memory ("EEPROM"), or any other medium which can be used to store the desired information and which can be accessed by the processor 802.

The voice-controlled device 800 includes a microphone unit that comprises one or more microphones 806 to receive audio input, such as user voice input. The device 800 also includes a speaker unit that includes one or more speakers 808 to output audio sounds. One or more codecs 810 are coupled to the microphone(s) 806 and the speaker(s) 808 to encode and/or decode audio signals. The codec(s) 810 may convert audio data between analog and digital formats. A user may interact with the device 800 by speaking to it, and the microphone(s) 806 captures sound and generates an audio signal that includes the user speech. The codec(s) 810 encodes the user speech and transfers that audio data to other components. The device 800 can communicate back to the user by emitting audible sounds or speech through the speaker(s) 808. In this manner, the user may interacts with the voice-controlled device 800 simply through speech, without use of a keyboard or display common to other types of devices.

In the illustrated example, the voice-controlled device 800 includes one or more wireless interfaces 812 coupled to one or more antennas 814 to facilitate a wireless connection to a network. The wireless interface(s) 812 may implement one or more of various wireless technologies, such as wifi, Bluetooth, RF, and so forth.

One or more device interfaces 816 (e.g., USB, broadband connection, etc.) may further be provided as part of the device 800 to facilitate a wired connection to a network, or a plug-in network device that communicates with other wireless networks.

The voice-controlled device 800 may be designed to support audio interactions with the user, in the form of receiving voice commands (e.g., words, phrase, sentences, etc.) from the user and outputting audible feedback to the user. Accordingly, in the illustrated implementation, there are no or few haptic input devices, such as navigation buttons, keypads, joysticks, keyboards, touch screens, and the like. Further there is no display for text or graphical output. In one implementation, the voice-controlled device 800 may include non-input control mechanisms, such as basic volume control button(s) for increasing/decreasing volume, as well as power and reset buttons. There may also be one or more simple light elements (e.g., LEDs around perimeter of a top portion of the device) to indicate a state such as, for example, when power is on or to indicate when a command is received. But, otherwise, the device 800 does not use or need to use any input devices or displays in some instances.

Several modules such as instruction, datastores, and so forth may be stored within the memory 804 and configured to execute on the processor 802. An operating system module 818, for example, may be configured to manage hardware and services (e.g., wireless unit, Codec, etc.) within and coupled to the device 800 for the benefit of other modules. In addition, the memory 804 may include one or more audio processing modules 820, which may be executed by the processor 802 to perform the clipping prevention described herein, as well as other audio processing functions such as those shown in FIGS. 6 and 7.

Although the example of FIG. 8 shows a programmatic implementation, the functionality described above may be performed by other means, including non-programmable elements such as analog components, discrete logic elements, and so forth. Thus, in some embodiments various ones of the components, functions, and elements described herein may be implemented using programmable elements such as digital signal processors, analog processors, and so forth. In other embodiments, one or more of the components, functions, or elements may be implemented using specialized or dedicated circuits. The term "component", as used herein, is intended to include any hardware, software, logic, or combinations of the foregoing that are used to implement the functionality attributed to the component.

Although the discussion above sets forth example implementations of the described techniques, other architectures may be used to implement the described functionality, and are intended to be within the scope of this disclosure. Furthermore, although specific distributions of responsibilities are defined above for purposes of discussion, the various functions and responsibilities might be distributed and divided in different ways, depending on circumstances.

Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. An audio processing device, comprising:
one or more audio processing components configured to process a sequence of stereo amplitudes, a first stereo amplitude in the sequence of stereo amplitudes comprising a left audio amplitude value and a right audio amplitude value;
a lookup table having gain values, wherein a first gain value in the lookup table has a first corresponding index value and a second gain value in the lookup table has a second corresponding index value, the second gain value being less than the first gain value;
the one or more audio processing components configured to perform acts comprising:
  determining an absolute value of the left audio amplitude value and an absolute value of the right audio amplitude value of the first stereo amplitude;
  determining a maximum of the absolute values of the left and right audio amplitude values;
  determining an amount by which the maximum of the absolute values of the left and right amplitude values exceeds a threshold, wherein the threshold is less than a clipping value;
  determining a particular index value as a mathematical product of a constant and the amount by which the maximum of the absolute values of the left and right amplitudes exceeds the threshold;
  retrieving, from the lookup table, one of the gain values that corresponds to the particular index value; and
  attenuating the left audio amplitude value and the right audio amplitude value of the first stereo amplitude sample in accordance with the retrieved one of the gain values to prevent signal clipping.

2. The computing device of claim 1, wherein the gain values of the lookup table decrease in accordance with a power function of the corresponding index values.

3. The computing device of claim 1, wherein the gain values of the lookup table decrease from a unity gain value as a function of the corresponding index values.

4. The computing device of claim 1, wherein attenuating the left and right audio amplitude values comprises multiplying the left and right audio amplitude values by the retrieved one of the gain values.

5. One or more non-transitory computer-readable media storing computer-executable instructions that, when executed by one or more processors, cause the one or more processors to perform acts comprising:
receiving a sequence of stereo amplitudes, a first stereo amplitude in the sequence of stereo amplitudes comprising a first audio amplitude value and a second audio amplitude value;
determining a first absolute value of the first audio amplitude value;
determining a second absolute value of the second audio amplitude value;
determining a maximum absolute value of the first absolute value and the second absolute value;
determining an amount by which the maximum absolute value exceeds a threshold;
determining an index value as a mathematical product of a constant and the amount;
retrieving, from a lookup table, a first gain value of gain values that corresponds to the index value; and
attenuating the first audio amplitude value in accordance with the first gain value;
attenuating the second audio amplitude value in accordance with the first gain value to prevent signal clipping; and
wherein the lookup table includes the gain values, wherein a first gain value has a first index value and a second gain value has a second index value, the second gain value being less than the first gain value.

6. The one or more non-transitory computer-readable media of claim 5, wherein the threshold is less than a clipping value.

7. The one or more non-transitory computer-readable media of claim 5, wherein the gain values of the lookup table decrease as a function of increasing index values.

8. The one or more non-transitory computer-readable media of claim 5, wherein the gain values of the lookup table decrease as a power function of increasing index values.

9. The one or more non-transitory computer-readable media of claim 5, wherein the gain values of the lookup table decrease from a unity gain as a function of increasing index values.

10. The one or more non-transitory computer-readable media of claim 5, wherein attenuating the first and second audio amplitude values comprises multiplying the first and second audio amplitude values by the first gain value.

11. The one or more non-transitory computer-readable media of claim 5, the acts further comprising multiplying the determined amount by a predetermined constant to determine the index value.

12. The one or more non-transitory computer-readable media of claim 5, wherein
the first audio amplitude value comprises a left audio amplitude value, and
the second audio amplitude value comprises a right audio amplitude value.

13. A method comprising:
receiving a sequence of stereo amplitudes, a first stereo amplitude in the sequence of stereo amplitudes comprising a first audio amplitude value and a second audio amplitude value;
by one or more processors determining a first absolute value of the first audio amplitude value;
determining a second absolute value of the second audio amplitude value;
determining a maximum absolute value of the first absolute value and the second absolute value;
determining an amount by which the maximum absolute value exceeds a threshold;
determining an index value as a mathematical product of a constant and the amount;
retrieving, from a lookup table, a first gain value of gain values that corresponds to the index value;
attenuating the first audio amplitude value in accordance with the first gain value;
attenuating the second audio amplitude value in accordance with the first gain value to prevent signal clipping; and
wherein the lookup table includes the gain values, wherein a first gain value has a first index value and a second gain value has a second index value, the second gain value being less than the first gain value.

14. The method of claim 13, wherein the threshold is less than a clipping value.

15. The method of claim 13, wherein the gain values of the lookup table decrease as a function of increasing index values.

16. The method of claim 13, wherein the gain values of the lookup table decrease as a power function of increasing index values.

17. The method of claim 13, wherein the gain values of the lookup table decrease from a unity gain as a function of increasing index values.

18. The method of claim 13, wherein determining an adjusted first audio amplitude value comprises multiplying the first audio amplitude value by the first gain value.

19. The method of claim 13, wherein attenuating the first and second audio amplitude values comprises multiplying the first and second audio amplitude values by the first gain value.

20. The method of claim 13, wherein determining the index value further comprises multiplying a predetermined constant by the amount by which the maximum absolute value exceeds the threshold.

21. The method of claim 13, wherein increasing index values correspond to decreasing gain values in the lookup table.

22. The method of claim 13, wherein
the first audio amplitude value comprises a left audio amplitude value, and
the second audio amplitude value comprises a right audio amplitude value.

* * * * *